(12) United States Patent
Lee et al.

(10) Patent No.: US 10,937,648 B2
(45) Date of Patent: Mar. 2, 2021

(54) GATE STACK DESIGNS FOR ANALOG AND LOGIC DEVICES IN DUAL CHANNEL SI/SIGE CMOS

(71) Applicant: International Business Machines Corporation, Armonk, NY (US)

(72) Inventors: Choonghyun Lee, Rensselaer, NY (US); Ruqiang Bao, Niskayuna, NY (US); Gen Tsutsui, Glenmont, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/737,539

(22) Filed: Jan. 8, 2020

(65) Prior Publication Data
US 2020/0144057 A1    May 7, 2020

Related U.S. Application Data

(62) Division of application No. 15/933,949, filed on Mar. 23, 2018, now Pat. No. 10,535,517.

(51) Int. Cl.
*H01L 27/12* (2006.01)
*H01L 21/02* (2006.01)
(Continued)

(52) U.S. Cl.
CPC ...... *H01L 21/02532* (2013.01); *H01L 21/324* (2013.01); *H01L 21/823807* (2013.01);
(Continued)

(58) Field of Classification Search
CPC ......... H01L 21/823828; H01L 29/4966; H01L 21/28255; H01L 21/28264; H01L 21/823821; H01L 21/823857; H01L 21/8258; H01L 27/0924; H01L 29/495; H01L 29/513; H01L 29/517;
(Continued)

(56) References Cited

U.S. PATENT DOCUMENTS 9,276,013 B1    3/2016    Doris et al.
9,362,179 B1    6/2016    Cheng et al.
(Continued)

OTHER PUBLICATIONS

Lee et al., "Selective GeOx-Scavenging from Interfacial Layer on Si1-xGex Channel for High Mobility Si/Si1-xGex CMOS Application," 2016 IEEE Symposium on VLSI Technology (Jun. 2016) (2 pages).
(Continued)

*Primary Examiner* — Robert G Bachner
(74) *Attorney, Agent, or Firm* — Douglas Pearson; Michael J. Chang, LLC

(57) ABSTRACT

Improved gate stack designs for Si and SiGe dual channel devices are provided. In one aspect, a method for forming a dual channel device includes: forming fins on a substrate, the fins including Si fins in combination with SiGe fins as dual channels of an analog device and a logic device, with the analog device and the logic device each having a Si fin and a SiGe fin; forming a silicon germanium oxide (SiGeOx) layer on the SiGe fins; annealing the SiGeOx layer to form a Si-rich layer on the SiGe fins via a reaction between SiGeOx and SiGe; and forming metal gates over the Si fins and over the Si-rich layer on the SiGe fins. A dual channel device is also provided.

20 Claims, 10 Drawing Sheets

(51) Int. Cl.
*H01L 27/092* (2006.01)
*H01L 29/66* (2006.01)
*H01L 21/84* (2006.01)
*H01L 21/8238* (2006.01)
*H01L 21/324* (2006.01)

(52) U.S. Cl.
CPC ........ *H01L 21/845* (2013.01); *H01L 27/0922* (2013.01); *H01L 27/1211* (2013.01); *H01L 29/66818* (2013.01)

(58) Field of Classification Search
CPC ......... H01L 29/66522; H01L 29/66545; H01L 29/66795; H01L 29/6681; H01L 29/785; H01L 21/823807; H01L 29/1054; H01L 27/092; H01L 21/823412; H01L 21/823462; H01L 21/84; H01L 27/0922; H01L 27/1203; H01L 29/78

See application file for complete search history.

(56) References Cited

U.S. PATENT DOCUMENTS

| | | |
|---|---|---|
| 9,741,822 B1 | 8/2017 | Jagannathan et al. |
| 9,786,664 B2 | 10/2017 | Czornomaz et al. |
| 2013/0032886 A1 | 2/2013 | Ando et al. |
| 2015/0028426 A1 | 1/2015 | Ching et al. |
| 2018/0211885 A1 | 7/2018 | Bao et al. |
| 2018/0315663 A1 | 11/2018 | Bao et al. |

OTHER PUBLICATIONS

Lee et al., "Engineering the Electronic Defect Bands at the Si1-xGex/IL Interface: Approaching the Intrinsic Carrier Transport in Compressively-Strained Si1-xGex pFETs," 2016 IEEE International Electron Devices Meeting (IEDM) (Dec. 2016) (4 pages).

Wang et al., "The analysis of device performance on a different shallow trench isolation (STI) liner scheme," 2012 23rd Annual Advanced Semiconductor Manufacturing Conference (ASMC), Introduction (May 2012) (1 page).

Yudhvir Singh Chib, "Development of Low Temperature Oxidation Process Using Ozone for VLSI," International Journal of Innovative Research in Electrical, Electronics, Instrumentation and Control Engineering, vol. 2, issue 8 (Aug. 2014) (6 pages).

List of IBM Patents or Applications Treated as Related (2 pages).

GATE STACK DESIGNS FOR ANALOG AND LOGIC DEVICES IN DUAL CHANNEL SI/SIGE CMOS

CROSS-REFERENCE TO RELATED APPLICATIONS

This application is a divisional of U.S. application Ser. No. 15/933,949 filed on Mar. 23, 2018, the contents of which are incorporated by reference herein.

FIELD OF THE INVENTION

The present invention relates to dual channel devices, and more particularly, to improved gate stack designs for silicon (Si) and silicon germanium (SiGe) dual channel devices.

BACKGROUND OF THE INVENTION

One of the promising dual channel complementary-metal oxide semiconductor (CMOS) integration schemes for future technologies is to use tensile-strained silicon (Si) for n-channel field-effect transistors (n-FETs) and compressively-strained silicon germanium (SiGe) grown on a Si substrate for p-channel FETs (p-FETs). However, a conventional strategy to fabricate both analog (I/O) and logic devices in Si/SiGe dual channel CMOS suffers from performance degradation of the SiGe p-FET due to a large amount of interface trap density (Dit), which is attributed to undesired germanium oxide (GeOx) formation in the interfacial layer as well as germanium (Ge) pile-up at the surface. See, for example, Lee et al., "Selective $GeO_x$-Scavenging from Interfacial Layer on $Si_{1-x}Ge_x$ Channel for High Mobility Si/$Si_{1-x}Ge_x$ CMOS Application," 2016 IEEE Symposium on VLSI Technology (June 2016) (2 pages) (GeOx formation in the interfacial layer) and Lee et al., "Engineering the Electronic Defect Bands at the $Si_{1-x}Ge_x$/IL Interface: Approaching the Intrinsic Carrier Transport in Compressively-Strained $Si_{1-x}Ge_x$ pFETs," 2016 IEEE International Electron Devices Meeting (IEDM) (December 2016) (4 pages) (Ge pile-up).

Therefore, techniques for improving analog and logic device performance in Si/SiGe dual channel CMOS would be desirable.

SUMMARY OF THE INVENTION

The present invention provides improved gate stack designs for silicon (Si) and silicon germanium (SiGe) dual channel devices. In one aspect of the invention, a method for forming a dual channel device is provided. The method includes: forming fins on a substrate, the fins including Si fins in combination with SiGe fins as dual channels of an analog device and a logic device, with the analog device and the logic device each having an Si fin and a SiGe fin; forming a silicon germanium oxide (SiGeOx) layer on the SiGe fins; annealing the SiGeOx layer to form a Si-rich layer on the SiGe fins via a reaction between SiGeOx and SiGe; and forming metal gates over the Si fins and over the Si-rich layer on the SiGe fins.

In another aspect of the invention, a dual channel device is provided. The dual channel device includes: fins on a substrate, the fins comprising Si fins in combination with SiGe fins as dual channels of an analog device and a logic device, with the analog device and the logic device each having a Si fin and a SiGe fin; a Si-rich layer disposed on the SiGe fins; and metal gates disposed over the Si fins and over the Si-rich layer on the SiGe fins.

A more complete understanding of the present invention, as well as further features and advantages of the present invention, will be obtained by reference to the following detailed description and drawings.

DETAILED DESCRIPTION OF PREFERRED EMBODIMENTS

Provided herein is a unique integration scheme for improving analog and logic device performance in silicon/silicon germanium (Si/SiGe) dual channel complementary metal-oxide semiconductor (CMOS). Advantageously, the present techniques are fully compatible with the current CMOS platform. By "dual channel" it is meant that each device, i.e., analog (also referred to herein as an input/output or I/O device) and logic device, includes two different channel materials such as Si and SiGe. More specifically, in the exemplary embodiments that follow, each device (analog or logic) includes a (e.g., Si) n-channel field effect transistor (n-FET) and a (e.g., SiGe) p-channel FET (p-FET). Further, according to an exemplary embodiment, each of the analog and logic devices are finFETs, having a (Si or SiGe) fin-shaped channel.

As will be described in detail below, the present techniques provide an effective integration scheme of a Si-rich SiGe fin surface to improve both analog and logic device performance on Si/SiGe dual channel CMOS. Silicon germanium oxide/silicon oxide (SiGeOx/SiO$_2$) dual oxide layers are used to have a reaction of SiGeOx with the SiGe surface (via an anneal), which gives a Si-rich surface on the SiGe fin. Advantageously, only the SiGe surface is modified due to the reaction of SiGeOx with the SiGe surface during the anneal. After the anneal, the Si-rich SiGe surface is formed, resulting in low interface trap charges and high hole mobility in the (SiGe) p-FET. For the Si (n-FET), there is no reaction of SiGeOx with the Si fin surface.

In order to appreciate the advantages of the present techniques, it is important to understand the drawbacks associated with conventional processes. As provided above, the fabrication of Si/SiGe dual channel devices typically suffers from performance degradation of the SiGe p-FET due to a large amount of interface trap density (Dit). This performance shortfall is due to undesired germanium oxide (GeOx) formation in the interfacial layer as well as germanium (Ge) pile-up at the surface. Namely, each of the devices includes a gate stack that is generally formed by first depositing a gate dielectric onto the (Si or SiGe) fin channel and then depositing a gate conductor(s) over the gate dielectric. Prior to placing the gate dielectric, an interfacial layer (IL) is formed on the exposed fin channel by, e.g., an oxidation process. With the Si fin, a silicon oxide (SiO$_x$-based interfacial layer is formed by this process. If both types (Si and SiGe) of fins are treated in the same manner, the interfacial layer formed on the SiGe fin will include both SiO$_x$ and GeOx due to the presence of Ge in the fin. This is undesirable due to the above-described performance degradation. However, formation of the Si-rich SiGe surface by way of the present techniques advantageously results in low interface trap charges and high hole mobility in the SiGe fins.

Figure 1:
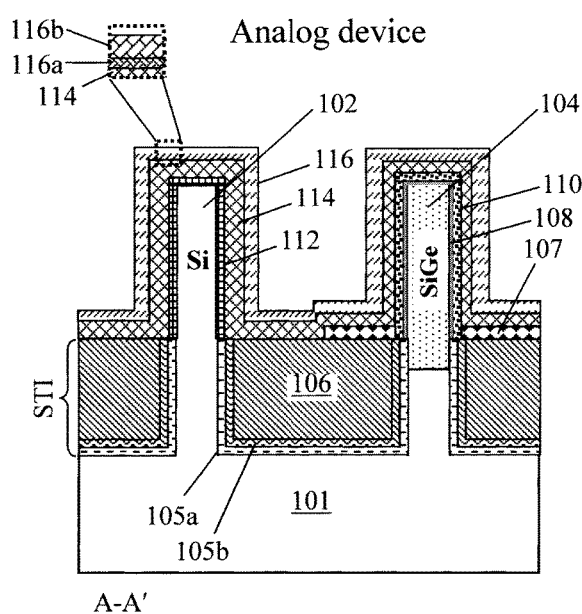
FIG. 1 is a cross-sectional diagram illustrating an analog device according to an embodiment of the present invention.
Figure 2:
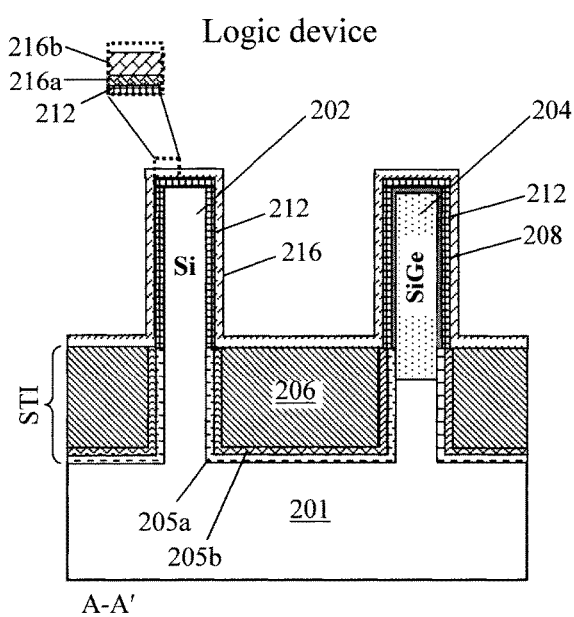
FIG. 2 is a cross-sectional diagram illustrating a logic device according to an embodiment of the present invention.

The present analog and logic device structures are shown illustrated in FIGS. 1 and 2, respectively. It is notable that, while the analog and logic devices are shown in separate figures, this is done merely for ease and clarity of depiction, and embodiments are contemplated herein where both (analog and logic) devices are formed (concurrently) on a common substrate. See below.

As shown in FIGS. 1 and 2, each of the analog and logic devices includes an n-FET and a p-FET, the basis for which are Si and SiGe fins, respectively. For clarity, these devices are also referred to herein as the analog or logic Si (n-FET) and SiGe (p-FET) devices. Further, the designations I and II may be used herein to distinguish the (dual channel) Si and SiGe fins of the analog versus logic devices. For instance, reference may be made herein to the analog device including a Si fin I and a SiGe fin I, and to the logic device having an Si fin II and a SiGe fin II. These designations I and II are arbitrary and meant solely to clarify reference to particular fins throughout the description.

Referring first to the analog device shown in FIG. 1, at least one Si fin 102 (e.g., a Si fin I) and at least one SiGe fin 104 (e.g., a SiGe fin I) are formed in a substrate 101. A variety of different substrate configurations can be implemented in accordance with the present techniques. For instance, according to one exemplary embodiment, the substrate is a bulk semiconductor wafer, such as a bulk Si, bulk Ge, and/or bulk SiGe semiconductor wafer. Alternatively, the substrate can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, and/or SiGe semiconductor.

Shallow trench isolation (STI) regions are used to isolate the fins 102/104. As will be described in detail below, the STI process involves first patterning a trench in the substrate, and then filling the trench with an insulator such as an STI oxide 106. As shown for example in FIGS. 1 and 2, a liner may be employed to line the trenches prior to the STI oxide fill. An STI liner can help trap mobile charges and to improve adhesion of the STI oxide to the substrate. See, for example, Wang et al., "The analysis of device performance on a different shallow trench isolation (STI) liner scheme," 2012 23$^{rd}$ Annual Advanced Semiconductor Manufacturing Conference (ASMC), Introduction (May 2012) (1 page), the contents of which are incorporated by reference as if fully set forth herein. In this particular example, a dual STI liner is used wherein an oxide layer 105a is first deposited lining the trench, followed by a nitride layer 105b. Suitable oxide STI liner materials include, but are not limited to, silicon oxide (SiO$_x$) and suitable nitride STI liner materials include, but are not limited to, silicon nitride (SiN).

In accordance with the present techniques, a Si-rich layer 108 is selectively formed on the SiGe fin. See, for example, Si-rich layer 108 formed on SiGe fin 104. According to an exemplary embodiment, Si-rich layer 108 is formed having a thickness of from about 0.5 nanometers (nm) to about 2 nm, and ranges therebetween. As highlighted above, this Si-rich layer is formed via a reaction of SiGeOx with the SiGe. As will be described in detail below, this process involves first depositing a SiGeOx layer (i.e., SiGeOx layer 107) onto the fins and then annealing the devices to react the SiGeOx with the SiGe fins to form the Si-rich layer 108 and a SiO$_2$ layer 110. No reaction will take place on the Si fins (or elsewhere—hence the unreacted SiGeOx layer 107 present on the STI oxide adjacent to the SiGe fin 104). As such, the Si-rich layer is absent from the Si fins. By Si-rich, it is meant generally that, post-reaction, the Si-rich layer 108 has a greater percentage of Si than the SiGe fin 104, which is apparent from the detailed description of the reaction provided in FIG. 3. Namely, the Si percentage of outer (Si-rich) surface layer on the SiGe fin 104 is much greater than the initial Si percentage. For instance, by way of example only, if the starting SiGe fin 104 has an atomic composition of 75% Si and 25% Ge, after chemical reaction of SiGeOx layer 107 and SiGe fin 104, the outer surface (Si-rich layer 108) preferably has an atomic composition of Si percentage of from about 80% to about 100% and ranges therebetween, or an atomic composition of Ge percentage of from about 20% to about 0% and ranges therebetween. The chemical reaction of SiGeOx and SiGe occurs as follows:

$$Si+Ge+SiO_2+GeO_2 \rightarrow Si+SiO_2+2GeO(\text{volatile material}).$$

Ge atoms in the SiGe layer/fin diffuses out by this reaction, resulting in the Si-rich layer covered by $SiO_2$.

Figure 3:
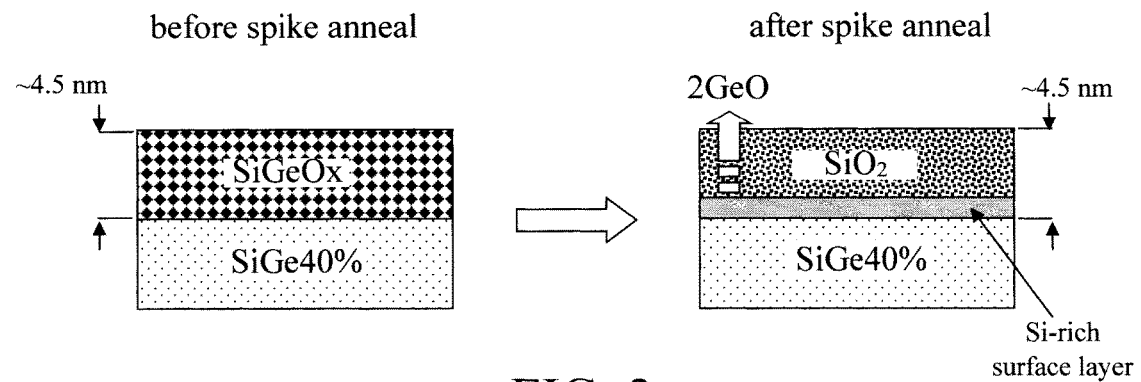
FIG. 3 is a diagram illustrating a reaction between SiGeOx and SiGe used to form an Si-rich layer according to an embodiment of the present invention.

Referring briefly to FIG. 3, a SiGeOx layer (such as SiGeOx layer 107) is deposited onto a SiGe channel (such as SiGe fin 104). For illustrative purposes only, the SiGe in this example contains 40% Ge (i.e., SiGe40%). Generally, however, the SiGe fins provided herein can contain from about 10% Ge to about 40% Ge, and ranges therebetween. The SiGeOx layer is a mixture of $SiO_2$ and $GeO_2$. Again, for illustrative purposes only, SiGeOx layer in this example is deposited to a thickness of about 4.5 nanometers (nm).

A spike anneal is then performed. According to an exemplary embodiment, the spike anneal is performed at a temperature of from about 1000° C. to about 1077° C., and ranges therebetween, for a duration of from about 1 second to about 5 seconds, and ranges therebetween. Preferably, the anneal is performed in the presence of an inert gas such as nitrogen ($N_2$). Performing the anneal in an inert gas ambient avoids undesirable oxidation of the semiconductor layer. The result is a surface modification of the SiGe channel due to the reaction:

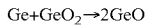
$$Ge+GeO_2 \rightarrow 2GeO$$

that occurs at the SiGeOx/SiGe channel interface during the spike anneal, forming a Si-rich surface layer (such as Si-rich layer 108) on the SiGe channel. As shown in FIG. 3, the 2GeO is a volatile component that is removed, via the reaction, from both the SiGeOx and the SiGe channel, resulting in the Si-rich surface layer on the SiGe channel. The reaction only happens at the SiGeOx/SiGe interface so that the entire SiGe percentage of SiGe channel does not change. As provided above, the SiGeOx layer is a mixture of $SiO_2$ and $GeO_2$. Thus, via the reaction, the SiGeOx is converted to $SiO_2$ forming oxide layer 110 on the Si-rich surface layer. As will be described in detail below, oxide layer 110 serves as an interfacial layer (IL) gate oxide in the analog SiGe device. As also shown in FIG. 3, the Si-rich surface layer+$SiO_2$ is approximately equivalent in thickness to the starting SiGeOx layer.

A thicker gate oxide is preferable for use in the analog devices, as compared to the logic devices. Namely, a thicker gate oxide permits a high voltage to be applied to the analog devices without reliability issues. Referring back to FIG. 1, a thicker gate oxide is achieved in the analog device through the use of a first IL gate oxide (either the oxide layer 110 formed via the above-described reaction on the SiGe fin 104 or via a chemical oxide layer 112 formed on the Si fin 102) in combination with an additional (second) IL gate oxide 114 that is deposited onto the first IL gate oxide. Specifically, as shown in FIG. 1 the SiGe fin 104 has Si-rich layer 108 and oxide layer 110 formed thereon via the above-described reaction. This oxide layer 110 serves as the first IL gate oxide on the SiGe fin 104. According to an exemplary embodiment, oxide layer 110 has a thickness of from about 2 nanometers (nm) to about 4 nm, and ranges therebetween, e.g., about 2.5 nm.

Since no reaction will occur on the Si fin 102, a chemical oxidation process is employed to form the chemical oxide layer 112 on the Si fin 102. This chemical oxide layer 112 serves as the first IL gate oxide on the Si fin 102. According to an exemplary embodiment, an ozone ($O_3$) chemical oxidation process is used whereby the Si fin is contacted with $O_3$ molecules. Advantageously, due to its high reactivity, $O_3$ is an ideal oxidant at low temperatures. See, for example, Yudhvir Singh Chib, "Development of Low Temperature Oxidation Process Using Ozone for VLSI," International Journal of Innovative Research in Electrical, Electronics, Instrumentation and Control Engineering, vol. 2, issue 8 (August 2014), the contents of which are incorporated by reference as if fully set forth herein. In one exemplary embodiment, the chemical oxidation is carried out at room temperature (e.g., from about 20° C. to about 25° C., and ranges therebetween) to form the chemical oxide layer 112 having a thickness of from about 0.5 nm to about 2 nm, and ranges therebetween, e.g., about 1 nm. It is notable that while oxide layer 110 and chemical oxide layer 112 in this example are both formed from $SiO_2$, different patterning is used in the drawings merely to distinguish which of these layers (i.e., layer 110) is generated during formation of the Si-rich layer 108, and which (i.e., layer 112) is formed via chemical oxidation.

The second IL gate oxide 114 is then deposited over the first gate oxide (i.e., oxide layer 110/chemical oxide layer 112). Suitable materials for the second IL gate oxide 114 include, but are not limited to, $SiO_2$. As shown in FIG. 1, the first and second IL gate oxides are formed as conformal layers over the fins 102/104. According to an exemplary embodiment, the second IL gate oxide 114 is formed having a thickness of from about 1 nm to about 3 nm, and ranges therebetween. Accordingly, the combined thickness of the first IL gate oxide and the second IL gate oxide (i.e., chemical oxide 112+second gate oxide 114 on the Si fin 102, or oxide layer 110+second gate oxide 114 on the SiGe fin 104) is from about 2 nm to about 6 nm, and ranges therebetween.

A conformal high-k metal gate 116 is disposed over the first/second IL gate oxides. As shown in FIG. 1, and as is the case for the other embodiments described herein, the high-k metal gate 116 includes a conformal gate dielectric 116a disposed on each of the fins 102/104 over the first/second IL gate oxides, and a conformal workfunction-setting metal layer 116b disposed on the gate dielectric 116a. Suitable gate dielectrics for metal gate 116 include, but are not limited to, high-K materials such as hafnium oxide ($HfO_2$) and/or lanthanum oxide ($La_2O_3$). The term "high-K" as used herein refers to a material having a relative dielectric constant K which is much higher than that of silicon dioxide (e.g., a dielectric constant K=25 for $HfO_2$ rather than 4 for silicon dioxide).

The particular workfunction-setting metal 116b employed can vary depending on whether an n-type or p-type device is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

Referring to the logic device illustrated in FIG. 2, the same general processes are employed as in the analog device. The notable difference is that, with the logic device, a thinner IL gate oxide is employed on the Si/SiGe fins 202/204, as compared to the logic device. This is achieved simply by foregoing deposition of a second IL gate oxide in the logic device, such that the IL gate oxide in the analog device is a single layer on the Si/SiGe fins 202/204.

Namely, as shown in FIG. 2 at least one Si fin 202 (e.g., a Si fin II) and at least one SiGe fin 204 (e.g., a SiGe fin II) are formed in a substrate 201. As noted above, while the logic and analog devices are shown in separate figures, it is anticipated that both logic and analog devices can be co-fabricated on a common substrate. Thus, substrate 101 (of FIG. 1) and substrate 201 (of FIG. 2) might in fact be one and the same. As provided above, a variety of different substrate configurations can be implemented in accordance with the present techniques. For instance, according to one exemplary embodiment, the substrate is a bulk semiconductor wafer, such as a bulk Si, bulk Ge, and/or bulk SiGe wafer. Alternatively, the substrate can be a SOI wafer, wherein the SOI layer includes any suitable semiconductor, such as Si, Ge and/or SiGe.

STI regions are used to isolate the fins 202/204. In the same manner as described above, the STI regions are formed by first patterning a trench in the substrate, and then filling the trench with an insulator such as an STI oxide 206 over a (e.g., dual STI liner). For instance, the dual STI liner includes an oxide layer 205a lining the trench, and a nitride layer 205b disposed on the oxide layer 205a. Suitable oxide STI liner materials include, but are not limited to, $SiO_x$ and suitable nitride STI liner materials include, but are not limited to, SiN.

An Si-rich layer 208 is selectively formed on the SiGe fin. According to an exemplary embodiment, Si-rich layer 208 is formed having a thickness of from about 0.5 nm to about 2 nm, and ranges therebetween. The reaction for selectively forming a Si-rich layer on a SiGe fin via a reaction of SiGeOx with the SiGe using an anneal was described, e.g., in conjunction with the description of FIG. 3 above, including the conditions (temperature and duration) for the anneal. A by-product of the reaction is the formation of a $SiO_2$ layer over the Si-rich layer 208. However, as will be described in detail below, this $SiO_2$ layer is stripped from the logic device and replaced with a chemical oxide 212 (which will serve as the IL gate oxide on the SiGe fin 204).

Being that the reaction for formation of the Si-rich layer 208 is exclusive for the SiGe fin 204, an IL gate oxide needs to be formed on the Si fin 202 prior to placement of the gate (note that, as provided above, the $SiO_2$ layer 212 serves as the IL gate oxide on the SiGe fin 204). In this particular example, the above-described chemical oxidation process is used to form a chemical oxide layer 212 on the Si fin 202 and on the SiGe fin 204. This chemical oxide layer 212 will serve as the (thinner) IL gate oxide in the logic device. According to an exemplary embodiment, the chemical oxide layer 212 has a thickness of from about 1 nm to about 3 nm, and ranges therebetween.

A conformal high-k metal gate 216 is then disposed over the chemical oxide layer 212. As provided above, the high-k metal gate 216 includes a conformal gate dielectric 216a disposed onto each of the fins 202/204 over the IL gate oxides, and a conformal workfunction-setting metal layer 216b disposed on the gate dielectric 216a. Suitable gate dielectrics for metal gate 216 include, but are not limited to, high-κ materials such as $HfO_2$ and/or $La_2O_3$. The particular workfunction-setting metal 216b employed can vary depending on whether an n-type or p-type device is desired. Suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and W. TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

Figure 4:
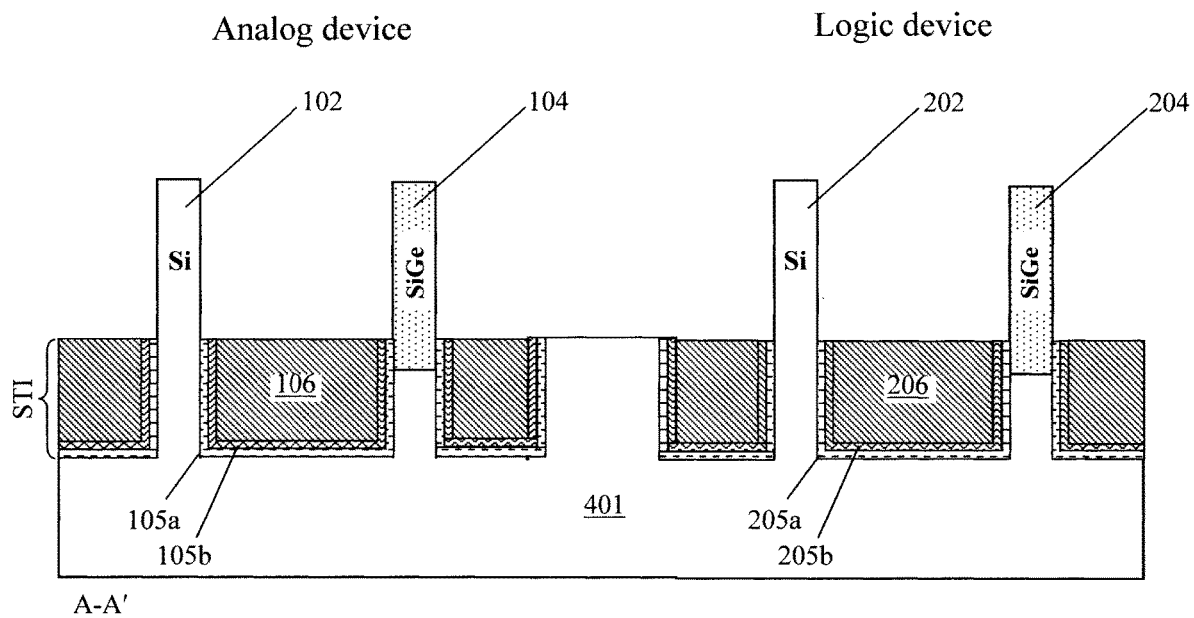
FIG. 4 is a cross-sectional diagram illustrating a starting structure for forming a dual channel device including fins formed on a substrate, the fins including Si fins in combination with SiGe fins as dual channels of an analog device and a logic device according to an embodiment of the present invention.
Figure 5:
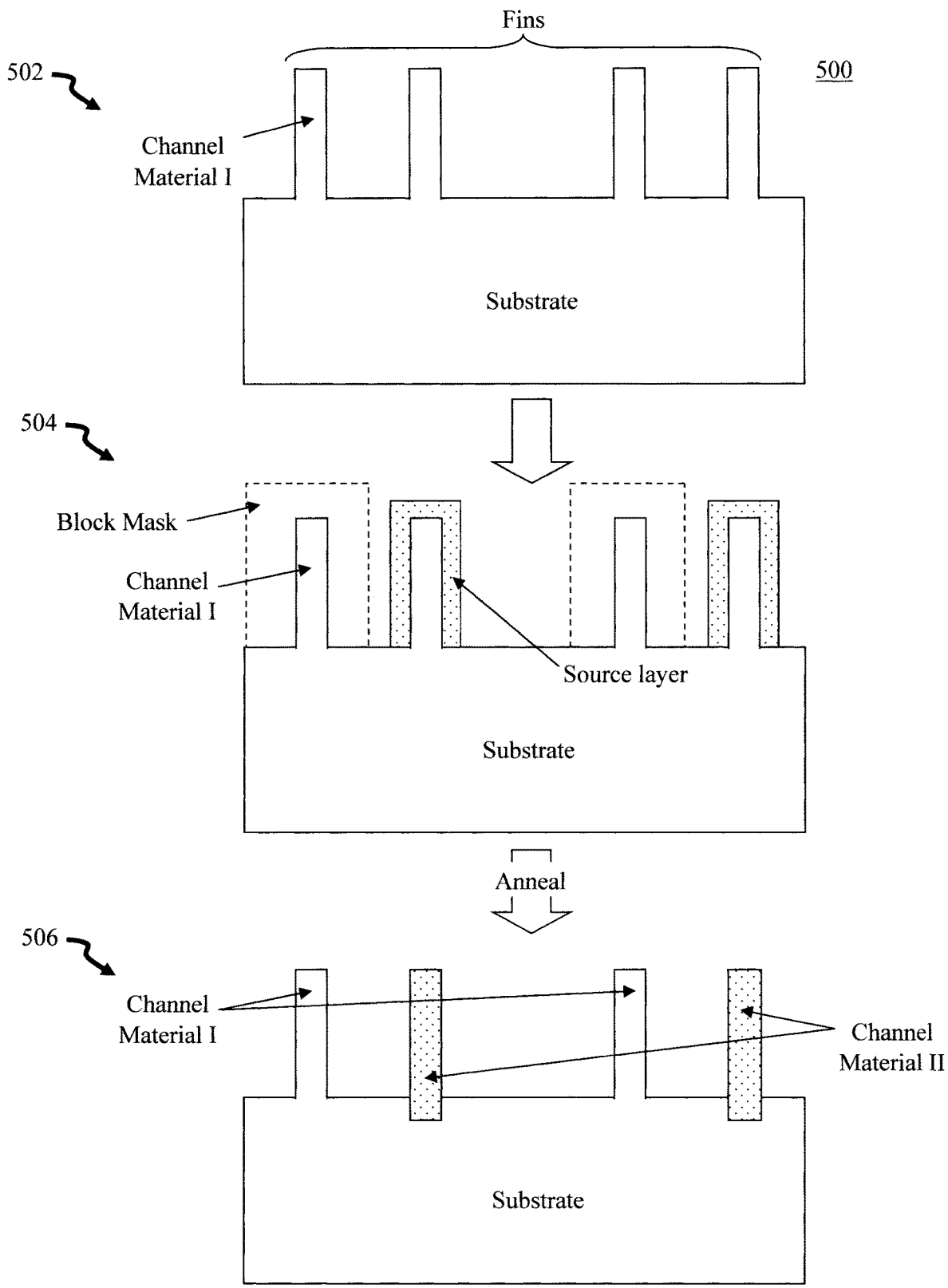
FIG. 5 is a diagram illustrating an exemplary methodology for forming dual fin channels on a common substrate according to an embodiment of the present invention.

An exemplary process for forming the analog and logic devices of FIGS. 1 and 2 is now described by way of reference to FIGS. 4-16. In this particular example, both analog and logic devices are formed concurrently on a same (i.e., common) substrate 401. As shown in FIG. 4, the process begins with the formation of at least one Si fin 102 and at least one SiGe fin 104 in a first region of the substrate 401 corresponding to the analog device, and at least one Si fin 202 and at least one SiGe fin 204 in a second region of the substrate 401 corresponding to the logic device. Like with substrates 101 and 201 above, substrate 401 can be a bulk semiconductor (e.g., Si, Ge, SiGe and/or III-V) wafer, or a SOI wafer with, e.g., a Si, Ge, SiGe, and/or a III-V semiconductor SOI layer.

A variety of different processes can be employed to form dual fin channels (i.e., fins formed from at least two different channel materials) on a common substrate. By way of example only, referring briefly to the exemplary methodology 500 shown in FIG. 5, in step 502 standard lithography and etching techniques are used to pattern fins in a substrate. The substrate in this example is formed from a first channel material (Channel Material I). For instance, the substrate can be formed from Si.

In this particular, non-limiting example, four fins have been patterned in the substrate. Like the structure shown in FIG. 4, the goal is to form two of the fins from the first channel material (e.g., Si) and the other two fins from a second, different channel material (Channel Material II, e.g., SiGe). The fins, as patterned, contain the first channel material (Channel Material I). For instance, in the case of a Si substrate, all four fins at this point in the process are Si fins. Those fins that are to remain Si fins are then masked using, for example, a standard block mask. Unmasked are the fins that will be converted to the second channel material (Channel Material II), and a source layer for the second channel material is deposited onto the unmasked fins. See step 504. For instance, in the case of as-patterned Si fins, a SiGe source layer will serve as a source of Ge atoms that can be driven into the Si fins to convert them into SiGe fins. Only those fins that have the source layer will be converted. The block mask can be removed at this stage in the process, or after the drive-in anneal that is next performed.

Namely, in step 506 an anneal is performed to drive atoms from the source layer into the fins. According to an exemplary embodiment, this drive-in anneal is performed at a temperature of from about 850° C. to about 1100° C., and ranges therebetween. Again using the example of as-patterned Si fins and a SiGe source layer, this anneal will serve to drive Ge atoms from the source layer into the Si fins to convert them into SiGe fins. As a result, fins will now be present on the substrate formed from two different channel materials, i.e., Channel Material I and Channel Material II—such as Si and SiGe, respectively. This process for forming dual channel material fins is also described in U.S. Pat. No. 9,276,013 issued to Doris et al., entitled "Integrated Formation of Si and SiGe Fins," the contents of which are incorporated by reference as if fully set forth herein.

Referring back to FIG. 4, STI regions are then formed to isolate the analog fins 102/104 and the logic fins 202/204. The STI process involves first patterning STI trenches in the substrate 401 in between the fins 102/104 and fins 202/204. An STI liner is then formed lining the trenches. As provided above, an STI liner advantageously helps trap mobile charges and improves adhesion of the STI oxide to the substrate. According to an exemplary embodiment, a dual STI liner is formed whereby the oxide layer 105a/205a (e.g., $SiO_x$) is first deposited conformally lining the trenches. The nitride layer 105b/205b (e.g., SiN) is then (conformally) deposited onto the oxide layer 105a/205a. Suitable deposition processes for these STI liner layers include, but are not limited to, chemical vapor deposition (CVD) and atomic layer deposition (ALD). The STI oxide 106/206 is then deposited onto the (dual) STI liner, filling the trenches. Processes such as CVD and ALD can be employed to deposit the STI oxide 106/206 to a thickness that pinches off the trenches.

Figure 6:
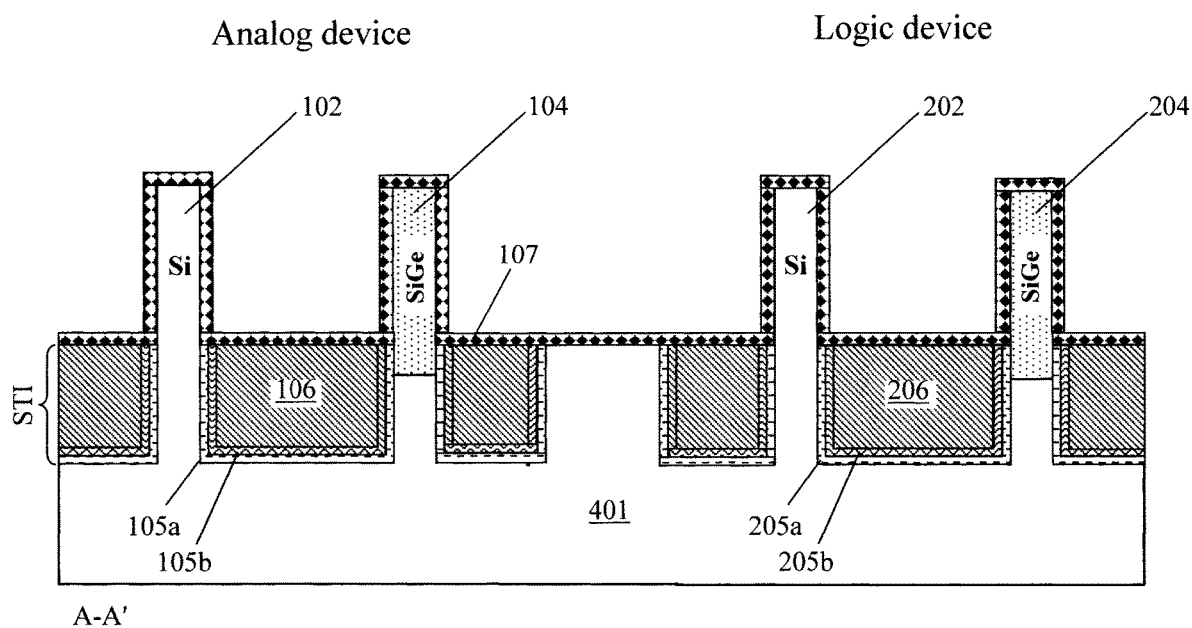
FIG. 6 is a cross-sectional diagram illustrating a conformal SiGeOx layer having been deposited onto the substrate over the fins according to an embodiment of the present invention.
Figure 7:
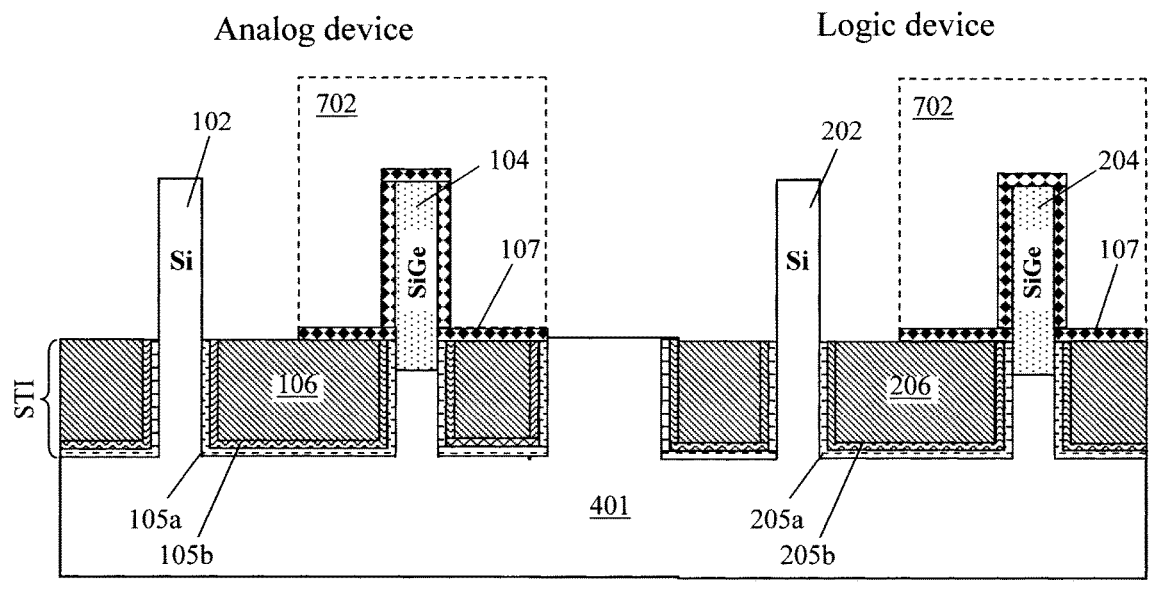
FIG. 7 is a cross-sectional diagram illustrating a mask having been formed on the SiGeOx layer over the SiGe fins, and an etch having been used to remove the SiGeOx layer from over the Si fins according to an embodiment of the present invention.
Figure 8:
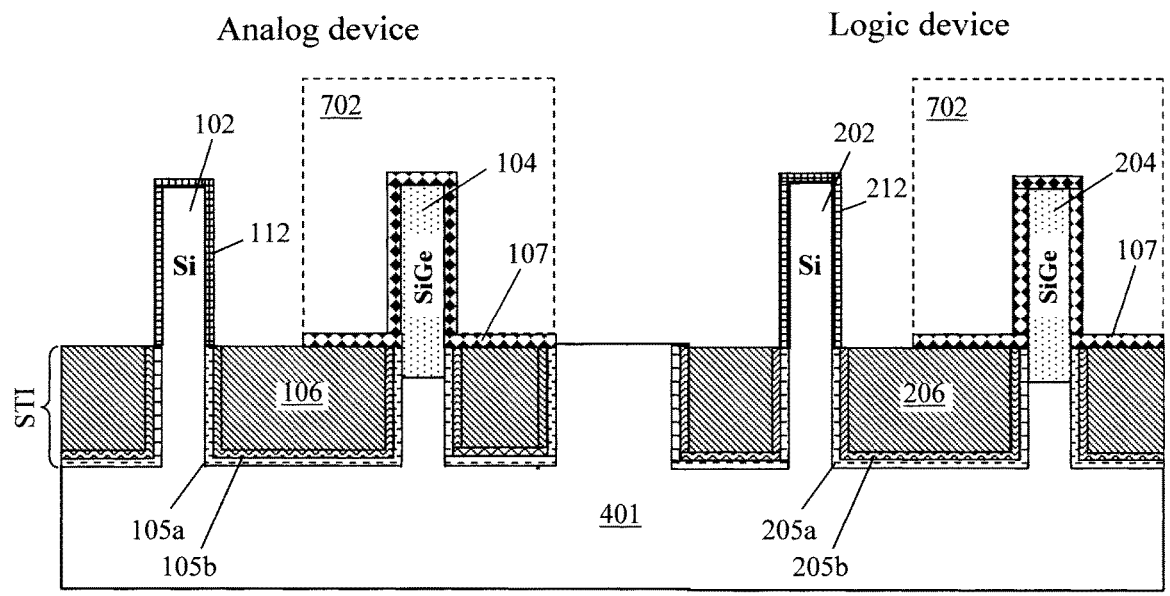
FIG. 8 is a cross-sectional diagram illustrating a chemical oxide having been formed on the Si fins as a (first) interlayer (IL) gate oxide according to an embodiment of the present invention.
Figure 9:
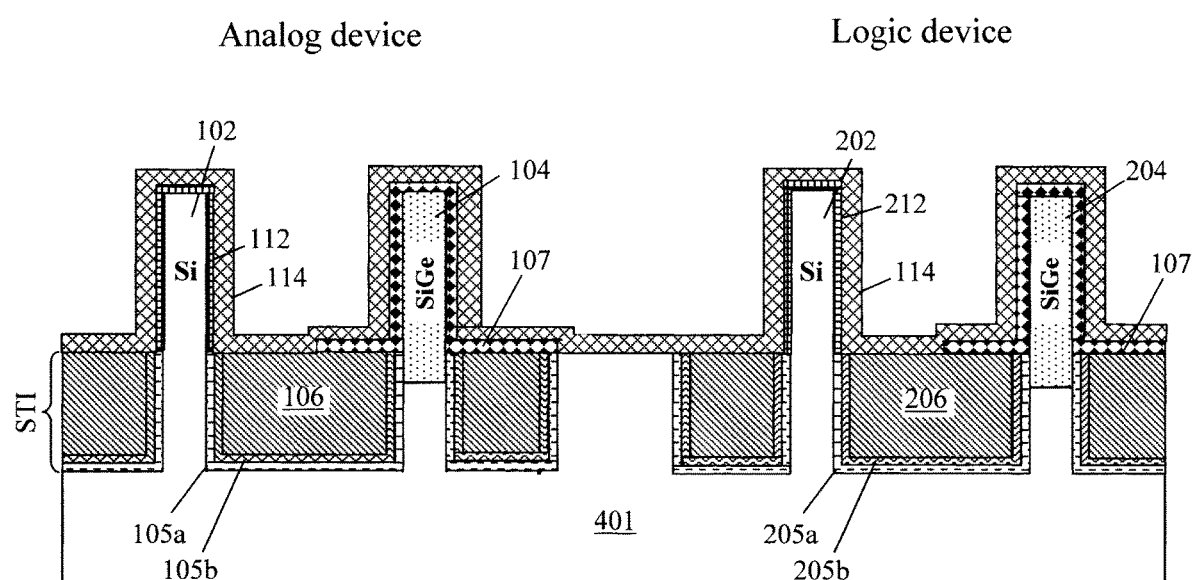
FIG. 9 is a cross-sectional diagram illustrating a (second) IL gate oxide layer having been blanket deposited over each of fins according to an embodiment of the present invention.

As described in detail above, the present techniques involve the formation of a Si-rich layer on the SiGe fins of both the analog and logic devices by reaction of SiGeOx with the SiGe surface. The Si-rich layer results in low interface trap charges and high hole mobility in the SiGe fin devices. Thus, as shown in FIG. 6, the SiGeOx layer 107 is deposited conformally onto the substrate 401 over the fins 102/104 and fins 202/204. According to an exemplary embodiment, the SiGeOx layer 107 is deposited using a process such as ALD to a thickness of from about 1 nm to about 3 nm, and ranges therebetween, e.g., about 1.5 nm. As shown in FIG. 6, the SiGeOx layer 107 deposited in this manner is present on the STI regions. This configuration is notable since, following the reaction of the SiGeOx layer 107 with the SiGe fins 104/204, there will be unreacted portions of the SiGeOx layer 107 remaining on the STI regions.

The SiGeOx layer 107 is only needed on the SiGe fins 104/204. Thus, according to an exemplary embodiment, the SiGeOx layer 107 is next removed from the Si fins 102/202. To do so, a mask 702 (such as a standard block mask) is formed selectively covering/masking the SiGeOx layer 107 over the SiGe fins 104/204. An etch is then used to pattern the SiGeOx layer 107, removing the (unmasked) portions of the SiGeOx layer 107 over the Si fins 102/202. See FIG. 7. According to an exemplary embodiment, the SiGeOx layer 107 is patterned using a wet etch with dilute hydrofluoric acid (dHF).

As described in detail above, the reaction of the SiGeOx with the SiGe fins 104/204 will result in the formation of a $SiO_2$ IL gate oxide ($SiO_2$ layer 110/210) on the SiGe fins 104/204. An IL gate oxide is also needed on the Si fins 102/202, which can be formed using a chemical oxidation process to form the chemical oxide 112/212 on the Si fins 102/202, respectively. See, for example, FIG. 8. According to an exemplary embodiment, the chemical oxide 112/212 is formed using an $O_3$ chemical oxidation process wherein the Si fins 102/202 are contacted with $O_3$ molecules under conditions sufficient to form the chemical oxide 112/212 (e.g., $SiO_2$) on the Si fins 102/202. Suitable conditions include, but are not limited to, a temperature of from about 20° C. to about 25° C., and ranges therebetween. In one exemplary embodiment, the chemical oxide 112/212 is formed having a thickness of from about 0.5 nm to about 2 nm, and ranges therebetween, e.g., about 1 nm. Following chemical oxidation, the mask 702 can be removed.

As described in detail above, a thicker IL gate oxide is preferably used in the analog device (as opposed to the logic device). The process employed herein to increase the thickness of the IL gate oxide in the analog device involves depositing an oxide layer 114 as a second IL gate oxide over the chemical oxide 112. See FIG. 9. As described above, the chemical oxide 112 is the first IL gate oxide for the analog Si fin. A subsequent reaction will be used to form the Si-rich layer on the SiGe fins along with an oxide layer (oxide layer 110) which will be the first IL gate oxide for the analog SiGe fin.

At this stage of the process, oxide layer 114 is blanket deposited over each of fins 102/104 and fins 202/204. However, a subsequent etch will be used to remove the oxide layer 114 from the logic device—see below—in order to provide a thinner gate oxide in the logic device. According to an exemplary embodiment, the oxide layer 114 is deposited using a process such as ALD to a thickness of from about 1 nm to about 3 nm, and ranges therebetween.

With the present example, a replacement metal gate process flow is employed. Early in a replacement metal gate process a sacrificial dummy gate is placed over a channel region of a device. This dummy gate will be removed later on in the process and replaced with a final metal gate of the device, i.e., a replacement metal gate or simply replacement gate. Thus, the dummy gate serves merely as a placeholder over the channel region and permits processes such as formation of the source and drain to be performed without exposing the replacement gate materials to potentially damaging conditions (such as elevated temperatures) that can harm device performance. For instance, according to an exemplary embodiment, the dummy gates are used during the high-temperature spike anneal to form the Si-rich layer (see above).

Figure 10:
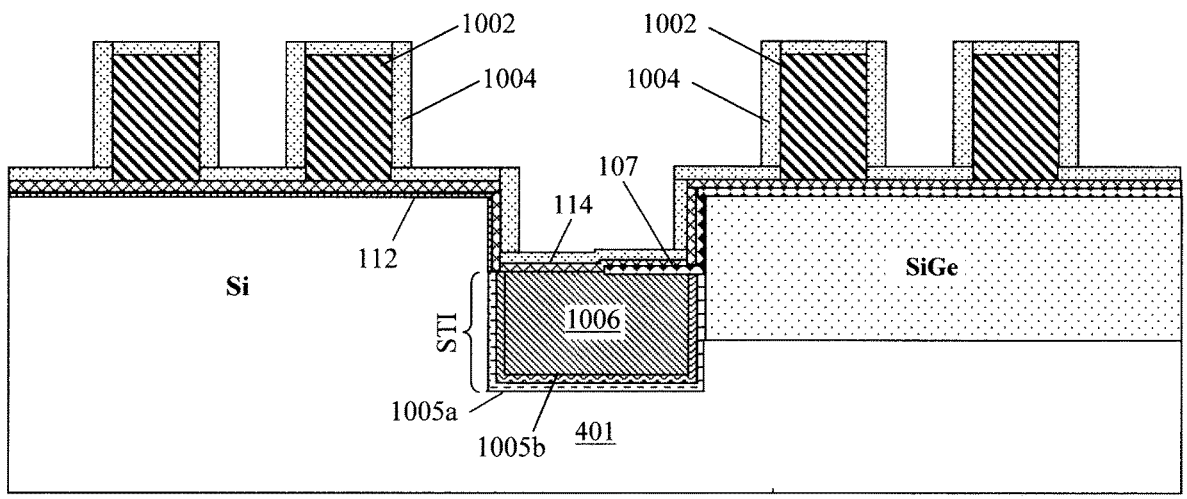
FIG. 10 is a cross-sectional diagram parallel to the fins illustrating dummy gates having been formed over the fins and a dummy gate spacer having been deposited over the dummy gates according to an embodiment of the present invention.

As such, to begin the replacement metal gate process, dummy gates 1002 are formed over the fins 102/104 and fins 202/204. See FIG. 10. FIG. 10 provides a different view of the device structure from the previous figures. Namely, FIGS. 1, 2 and 4-9 illustrate cross-sectional cuts through the device structure perpendicular to the fins, whereas FIG. 10 illustrates a cross-sectional cut through the device structure parallel to the fins (see, for example, cross-sectional cut A-A' perpendicular to the fins and cross-sectional cut B-B' parallel to the fins in FIG. 11—described below). The dummy gates 1002 are formed by first depositing a suitable dummy gate material over the fins 102/104 and fins 202/204, and then using standard lithography and etching techniques to pattern the dummy gate material into the individual dummy gates 1002. Suitable dummy gate materials include, but are not limited to, poly-silicon (poly-Si) and/or amorphous Si.

Some notable features are shown illustrated in FIG. 10. First, according to an exemplary embodiment, the fins can be configured on the substrate 401 with one type of fin (Si or SiGe) arranged lengthwise in front of/behind the other.

Thus, based on the orientation of the cross-sectional cuts A-A' and B-B', in the example depicted in FIG. 10 there is a SiGe fin behind a Si fin. The next fins over would have the opposite orientation (i.e., a Si fin behind a SiGe fin) in order to provide a dual channel for adjacent devices. As shown in FIG. 10, the front and back fins are separated by an STI region which is configured in the same manner as above, e.g., with an STI oxide 1006 over a dual STI liner having an oxide layer 1005a (e.g., $SiO_x$) and a nitride layer 1005b (e.g., SiN) disposed on the oxide layer 1005a.

Another notable feature illustrated in FIG. 10 is that more than one dummy gate 1002 can be formed on a given fin. The dummy gates 1002 are formed (on the second IL gate oxide 114) over portions of the fins 102/104 and fins 202/204 that will serve as channel regions of the respective (analog or logic) devices. As will be described in detail below, the portions of the fins 102/104 and fins 202/204 extending laterally to either side of the dummy gates 1002 will serve as the source and drain regions of the respective (analog or logic) devices. Thus, as illustrated in FIG. 10, each of the fins 102/104 and fins 202/204 can serve as the basis for forming more than one (analog or logic) device.

A dummy gate spacer 1004 is then deposited (conformally) over the dummy gates 1002 and on the second IL gate oxide 114 using a process such as CVD or ALD. Suitable materials for dummy gate spacer 1004 include, but are not limited to, silicon nitride (SiN), siliconborocarbonitride (SiBCN) and/or silicon carbide nitride (SiCN).

Figure 11:
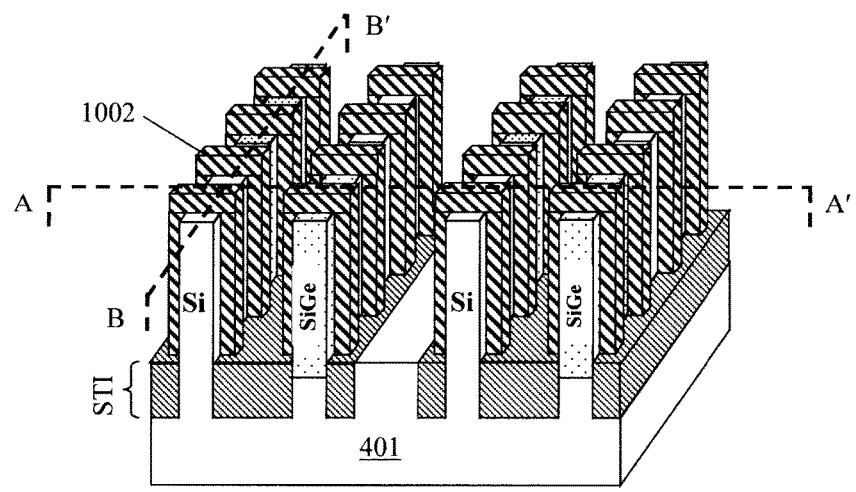
FIG. 11 is a three-dimensional depiction of the present device structure that provides a key to the various cross-sectional views presented herein according to an embodiment of the present invention.

FIG. 11 is three-dimensional depiction of the present device structure that provides a key to the various cross-sectional views presented herein. FIG. 11 is intended merely to orient these cross-sectional views relative to the Si/SiGe fins, substrate and dummy gates, with other details omitted for ease and clarity of depiction. As shown in FIG. 11, the cross-sectional view A-A' depicts a cut perpendicular to the fins through the dummy gates over adjacent fins, whereas the cross-sectional view B-B' depicts a cut parallel to the fins and through the dummy gates along a given fin.

Figure 12:
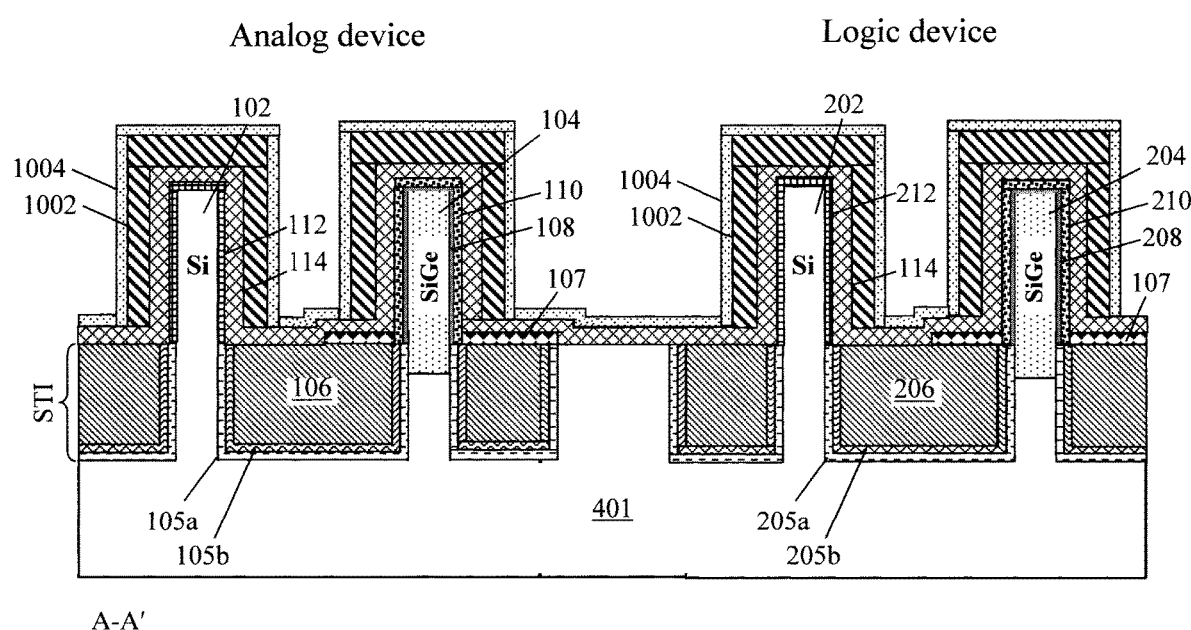
FIG. 12 is a cross-sectional diagram illustrating a spike anneal having been carried out to form the Si-rich layers on the SiGe fins due to the reaction of the SiGeOx layer and the SiGe fin surface according to an embodiment of the present invention.
Figure 13:
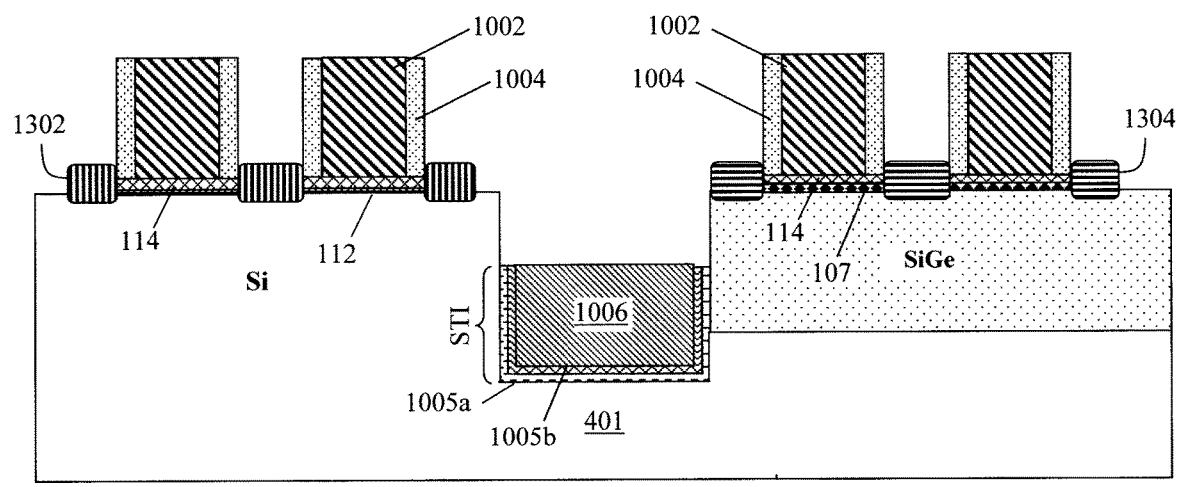
FIG. 13 is a cross-sectional diagram parallel to the fins illustrating source and drains having been formed on opposite sides of the dummy gates according to an embodiment of the present invention.

As shown in FIG. 12, following formation of the dummy gates 1002 and dummy gate spacers 1004, the above-described spike anneal is carried out to form the Si-rich layers 108/208 on the SiGe fins 104/204, respectively, due to the reaction of the SiGeOx layer 107 and the SiGe fin surface. It is notable that, as shown in FIG. 12, the SiGeOx layer 107 on the STI region remains without the chemical reaction.

According to an exemplary embodiment, the spike anneal is performed in an inert gas (e.g., $N_2$) ambient at a temperature of from about 1000° C. to about 1077° C., and ranges therebetween, for a duration of from about 1 second to about 5 seconds, and ranges therebetween. By the reaction, the SiGeOx is converted to $SiO_2$ forming oxide layers 110/210 on the Si-rich layers 108/208, respectively. According to an exemplary embodiment, the Si-rich layers 108/208 each have a thickness of from about 0.5 nm to about 2 nm, and ranges therebetween, and the oxide layers 110/210 each have a thickness of from about 2 nm to about 4 nm, and ranges therebetween, e.g., about 2.5 nm. As described above, the oxide layer 110 will serve as a first IL gate oxide in the analog SiGe device, while the oxide layer 210 is removed and replaced with a chemical oxide in the logic SiGe device.

Source and drains 1302 and 1304 are then formed on opposite sides of the dummy gates 1002, e.g., over the Si and SiGe fins respectively. See FIG. 13 (a cross-sectional cut through the device structure parallel to the fins). Prior to forming the source and drains 1302 and 1304, the dummy gate spacers 1004 and underlying SiGeOx layer 107, chemical oxide 112, second IL gate oxide 114 outside of the dummy gates 1002 are first removed from horizontal surfaces. Source and drains 1302 and 1304 can be formed from an epitaxial material that is doped in-situ (dopant introduced during growth) or ex-situ (e.g., via ion implantation). Suitable n-type dopants include, but are not limited to, phosphorous and arsenic. Suitable p-type dopants include, but are not limited to, boron. According to an exemplary embodiment, the source and drains 1302 are formed from phosphorus-doped Si (Si:P) and the source and drains 1304 are formed from boron-doped SiGe (SiGe:B).

Figure 14:
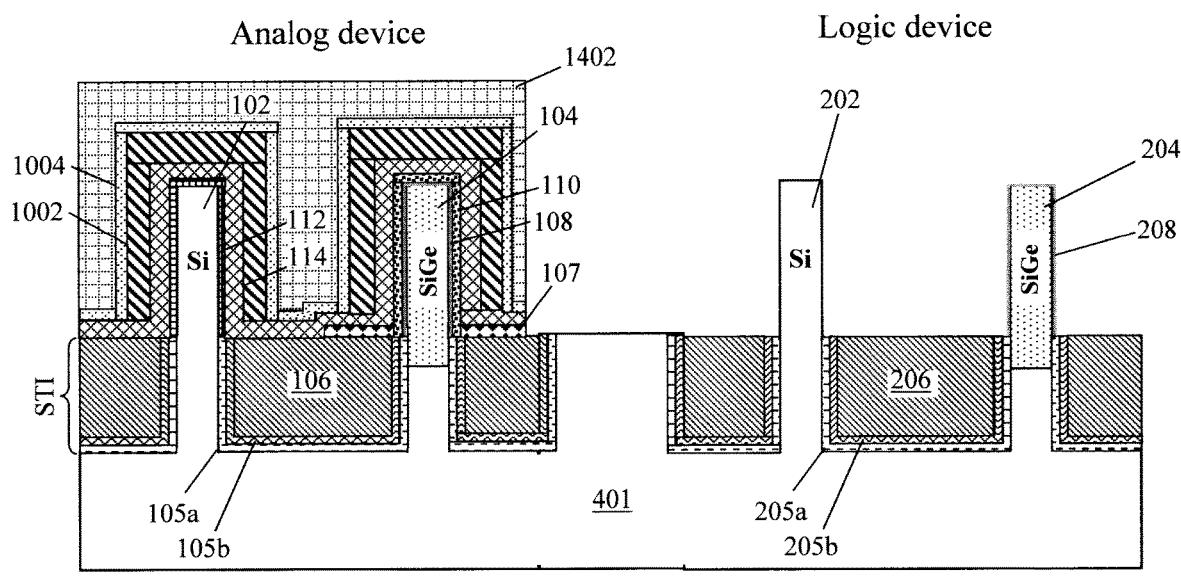
FIG. 14 is a cross-sectional diagram illustrating a hardmask having been formed over the analog device, and an etch having been used to remove all but the Si-rich layer from the logic device according to an embodiment of the present invention.

Referring back to a cross-sectional cut perpendicular to the fins, as shown in FIG. 14, standard lithography and etching techniques are next used to pattern a hardmask 1402 selectively covering/masking the analog device. An etch, or series of etching steps, are then used to remove all but the Si-rich layer 208 from the logic device. Namely, comparing FIG. 12 and FIG. 13 it can be seen that the dummy gates 1002 and dummy gate spacers 1004, as well as the oxide layers 114, 210 and 212 have been removed from fins 202 and 204, leaving only the Si-rich layer 208 present on (SiGe) fin 204. By way of example only, a series of reactive ion etching (RIE) steps with selective etch chemistries may be employed to strip the logic fins with, e.g., an oxide-selective RIE as the last step to remove the oxide layer 210 selective to the Si-rich layer 208.

Figure 15:
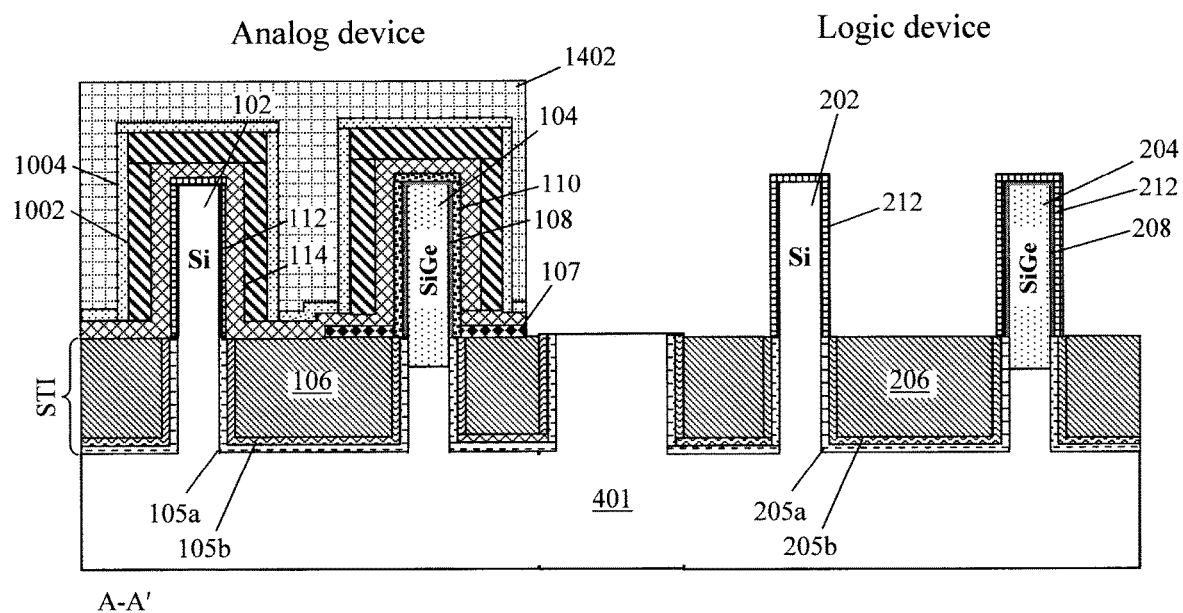
FIG. 15 is a cross-sectional diagram illustrating a chemical oxide layer having been formed directly on the Si fin, and on the SiGe fin over the Si-rich layer in the logic device according to an embodiment of the present invention.
Figure 16:
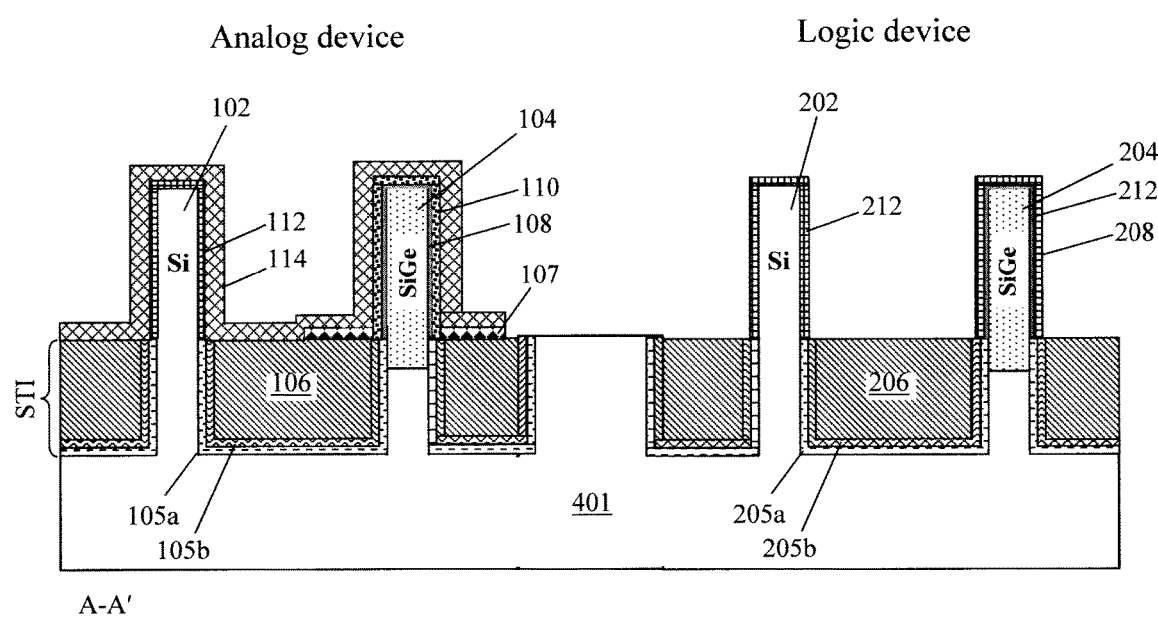
FIG. 16 is a cross-sectional diagram illustrating the dummy gates and dummy gate spacers having been removed from the analog device according to an embodiment of the present invention.

The above-described chemical oxidation process is then employed to form chemical oxide layer 212 on (Si/SiGe) fins 202/204. See FIG. 15. Specifically, as shown in FIG. 15, chemical oxide layer 212 is formed directly on (Si) fin 202, and on the (SiGe) fin 204 over the Si-rich layer 208. According to an exemplary embodiment, chemical oxide layer 212 has a thickness of from about 0.5 nm to about 2 nm, and ranges therebetween, e.g., about 1 nm.

Figure 17:
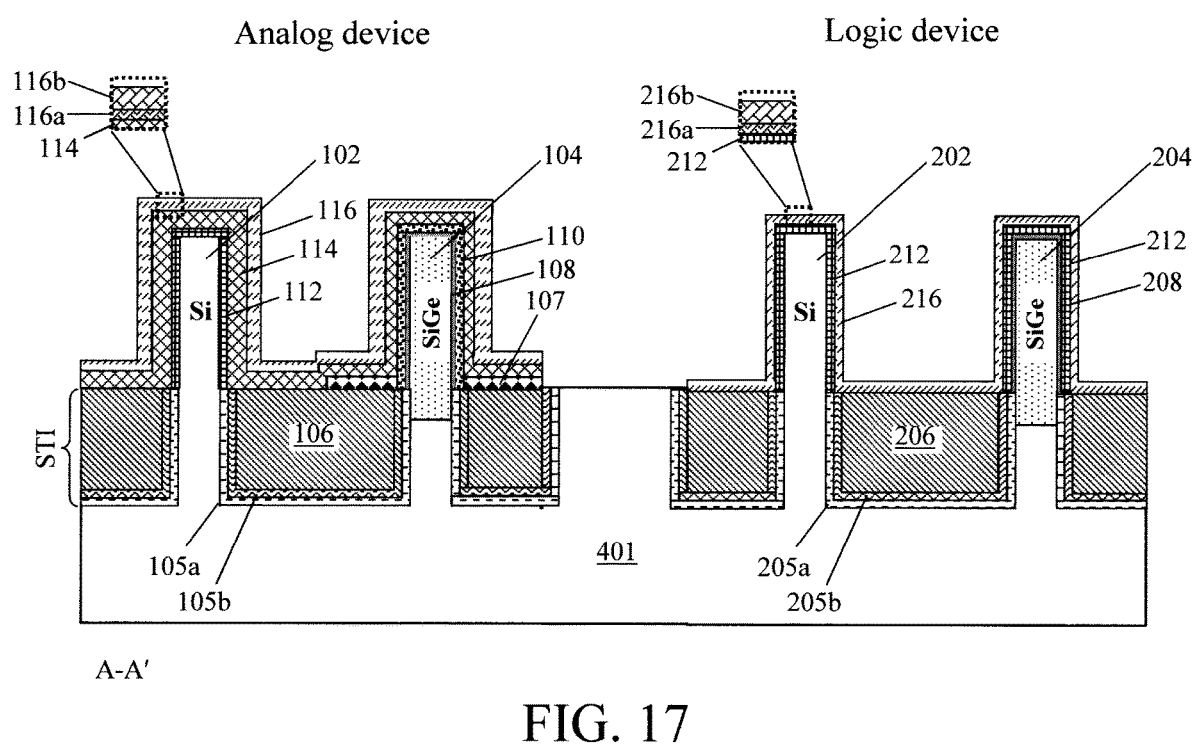
FIG. 17 is a cross-sectional diagram illustrating replacement high-k metal gates having been formed (in place of the dummy gates) over the fins in the analog device and the logic device according to an embodiment of the present invention.

Removal of the hardmask 1402, permits the dummy gates 1002 and dummy gate spacers 1004 to be also be removed from the analog device. See FIG. 16. Replacement high-k metal gates 116 and 216 are then formed (in place of the dummy gates) over the fins 102/104 in the analog device and over the fins 202/204 in the logic device. See FIG. 17. As shown in FIG. 17, the high-k metal gate 116 includes a conformal gate dielectric 116a deposited onto each of the fins 102/104 over the oxide layer 114, and a conformal workfunction-setting metal layer 116b disposed onto the gate dielectric 116a. The high-k metal gate 216 includes a conformal gate dielectric 216a deposited onto each of the fins 202/204 over the chemical oxide layer 212, and a conformal workfunction-setting metal layer 216b disposed onto the gate dielectric 216a. Suitable gate dielectrics and workfunction-setting metals for high-k metal gates 116/216 were provided above.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A dual channel device, comprising:
   fins on a substrate, the fins comprising silicon (Si) fins in combination with silicon germanium (SiGe) fins as dual channels of an analog device and a logic device, with the analog device and the logic device each comprising a Si fin and a SiGe fin;
   a Si-rich layer disposed on the SiGe fins; and metal gates disposed over the Si fins and over the Si-rich layer on the SiGe fins.

2. The dual channel device of claim 1, wherein the Si-rich layer has a Si concentration of from about 80% to about 100%, and ranges therebetween.

3. The dual channel device of claim 1, further comprising: shallow trench isolation (STI) regions present in the substrate between the fins.

4. The dual channel device of claim 3, wherein the STI regions comprise an STI oxide disposed over a dual STI liner.

5. The dual channel device of claim 4, wherein the dual STI liner comprises:
an oxide layer; and
a nitride layer disposed on the oxide layer.

6. The dual channel device of claim 3, further comprising:
a silicon germanium oxide (SiGeOx) layer on the STI regions adjacent to the SiGe fin in the analog device.

7. The dual channel device of claim 1, further comprising: a chemical oxide formed on the Si fins.

8. The dual channel device of claim 1, further comprising: a chemical oxide formed on the Si-rich layer of the SiGe fin of the logic device.

9. The dual channel device of claim 1, further comprising:
an oxide layer, over the Si-rich layer, on the SiGe fin of the analog device;
a chemical oxide formed on the Si fin of the analog device, wherein the oxide layer and the chemical oxide serve as a first IL gate oxide of the analog device; and
a second IL gate oxide disposed over the first IL gate oxide in the analog device.

10. The dual channel device of claim 1, wherein the metal gates comprise:
a gate dielectric; and
a workfunction-setting metal disposed on the gate dielectric.

11. The dual channel device of claim 10, wherein the gate dielectric is selected from the group consisting of: hafnium oxide ($HfO_2$), lanthanum oxide ($La_2O_3$), and combinations thereof.

12. The dual channel device of claim 10, wherein the workfunction-setting metal is selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

13. The dual channel device of claim 1, wherein the Si-rich layer has a thickness of from about 0.5 nm to about 2 nm, and ranges therebetween.

14. A dual channel device, comprising:
fins on a substrate, the fins comprising Si fins in combination with SiGe fins as dual channels of an analog device and a logic device, with the analog device and the logic device each comprising a Si fin and a SiGe fin;
a Si-rich layer disposed on the SiGe fins;
metal gates disposed over the Si fins and over the Si-rich layer on the SiGe fins;
STI regions present in the substrate between the fins; and
a SiGeOx layer on the STI regions adjacent to the SiGe fin in the analog device.

15. The dual channel device of claim 14, wherein the Si-rich layer has a Si concentration of from about 80% to about 100%, and ranges therebetween.

16. The dual channel device of claim 14, further comprising:
a chemical oxide formed on the Si fins.

17. The dual channel device of claim 14, further comprising:
a chemical oxide formed on the Si-rich layer of the SiGe fin of the logic device.

18. The dual channel device of claim 14, further comprising:
an oxide layer, over the Si-rich layer, on the SiGe fin of the analog device;
a chemical oxide formed on the Si fin of the analog device, wherein the oxide layer and the chemical oxide serve as a first IL gate oxide of the analog device; and
a second IL gate oxide disposed over the first IL gate oxide in the analog device.

19. The dual channel device of claim 14, wherein the metal gates comprise:
a gate dielectric; and
a workfunction-setting metal disposed on the gate dielectric.

20. The dual channel device of claim 19, wherein the gate dielectric is selected from the group consisting of: $HfO_2$, $La_2O_3$, and combinations thereof, and wherein the workfunction-setting metal is selected from the group consisting of: TiN, TaN, Al-containing alloys, TiAl, TiAlN, TiAlC, TaAl, TaAlN, TaAlC, W, and combinations thereof.

* * * * *